(12) United States Patent
Macris

(10) Patent No.: US 6,743,972 B2
(45) Date of Patent: Jun. 1, 2004

(54) HEAT DISSIPATING IC DEVICES

(76) Inventor: Chris Macris, P.O. Box 2660, North Bend, WA (US) 98045

( * ) Notice: Subject to any disclaimer, the term of this patent is extended or adjusted under 35 U.S.C. 154(b) by 0 days.

(21) Appl. No.: 09/927,276

(22) Filed: Aug. 10, 2001

(65) Prior Publication Data

US 2002/0134419 A1 Sep. 26, 2002

Related U.S. Application Data

(63) Continuation-in-part of application No. 09/664,121, filed on Sep. 18, 2000.

(51) Int. Cl.$^7$ .................... H01L 35/34; H01L 35/28; H01L 35/30; H01L 23/34; F25B 21/02
(52) U.S. Cl. ............... 136/201; 136/204; 136/205; 257/713; 257/717; 257/719; 257/722; 257/930; 62/3.2
(58) Field of Search .................. 136/203, 205, 136/201, 204, 200, 225; 62/3.2, 3.3; 257/930, 712, 713, 717, 718, 719, 722

(56) References Cited

U.S. PATENT DOCUMENTS

| | | | |
|---|---|---|---|
| 3,635,037 A | * | 1/1972 | Hubert .................... 62/3.2 |
| 4,092,614 A | | 5/1978 | Sakuma et al. ......... 331/94.5 P |
| 4,211,888 A | | 7/1980 | Stein et al. ................... 136/225 |
| 5,022,928 A | * | 6/1991 | Buist .......................... 136/212 |
| 5,032,897 A | * | 7/1991 | Mansuria et al. ............ 257/701 |
| 5,051,865 A | | 9/1991 | Kato .......................... 361/386 |
| 5,061,987 A | | 10/1991 | Hsia ............................ 357/71 |
| 5,229,327 A | | 7/1993 | Farnworth ................... 437/209 |
| 5,598,031 A | | 1/1997 | Groover et al. ............. 257/668 |
| 5,637,921 A | * | 6/1997 | Burward-Hoy ............. 257/712 |
| 5,714,791 A | | 2/1998 | Chi et al. .................... 257/467 |
| 5,793,107 A | | 8/1998 | Nowak ....................... 257/717 |
| 5,837,929 A | | 11/1998 | Adelman .................... 136/225 |
| 5,956,569 A | | 9/1999 | Shiu et al. .................... 438/48 |
| 6,080,608 A | | 6/2000 | Nowak ....................... 438/151 |
| 6,094,919 A | * | 8/2000 | Bhatia ......................... 62/3.7 |
| 6,121,661 A | | 9/2000 | Assaderaghi et al. ....... 257/355 |
| 6,162,659 A | | 12/2000 | Wu ............................. 438/106 |
| 6,166,411 A | | 12/2000 | Buynoski .................... 257/347 |
| 6,196,002 B1 | | 3/2001 | Newman et al. ............. 62/3.7 |

* cited by examiner

Primary Examiner—Patrick Ryan
Assistant Examiner—Thomas H. Parsons
(74) Attorney, Agent, or Firm—Jensen & Puntigam, PS

(57) ABSTRACT

Heat dissipating IC devices including at least one IC die comprising a semiconductor substrate with circuitry which utilize thermoelectric effects to more effectively dissipate thermal energy from electronic circuits.

40 Claims, 9 Drawing Sheets

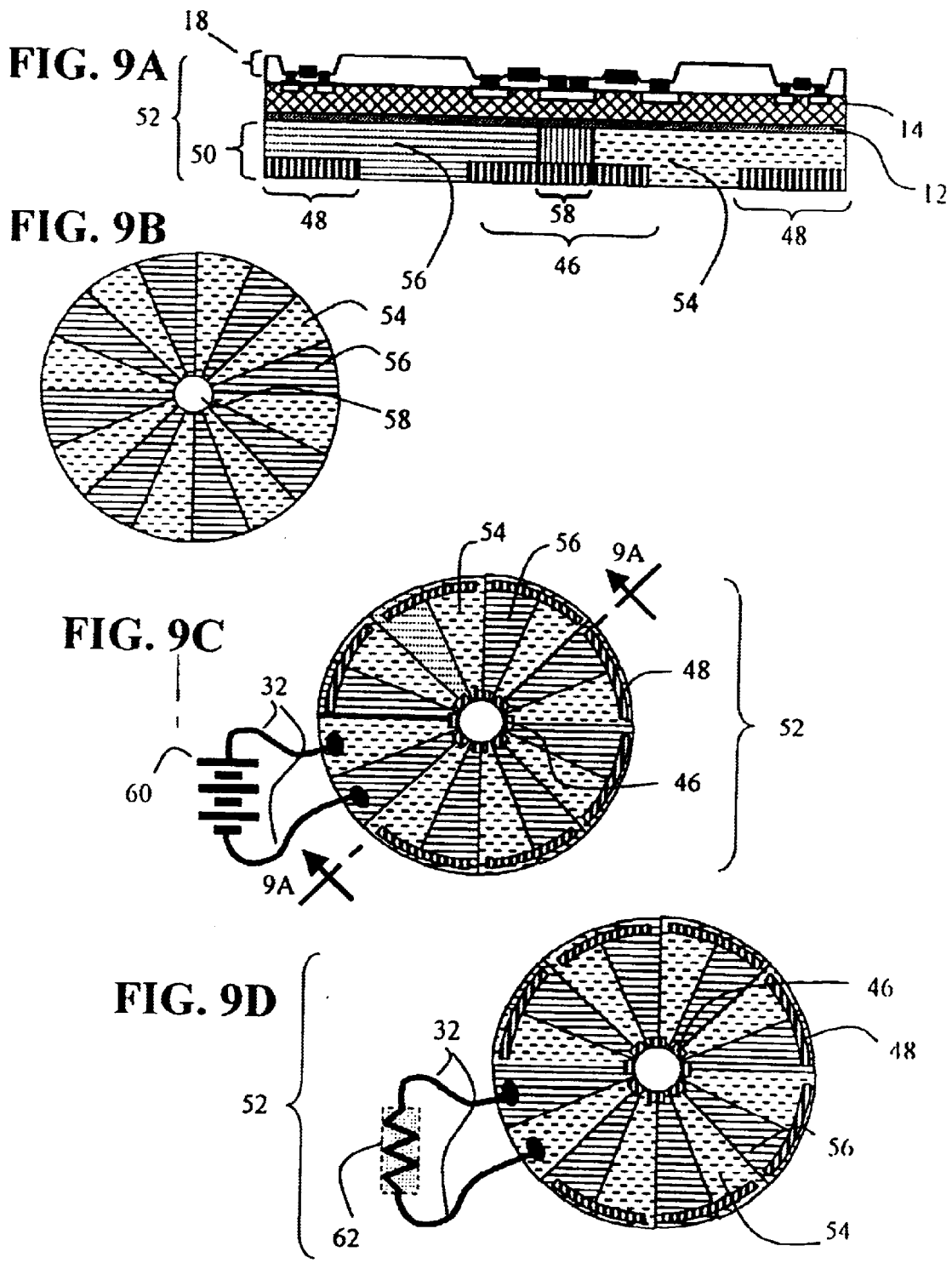

HEAT DISSIPATING IC DEVICES

CROSS-REFERENCE TO RELATED APPLICATIONS

The present application is a continuation-in-part of, and claims priority from, application Ser. No. 09/664,121 filed Sep. 18, 2000, and still pending.

BACKGROUND OF THE INVENTION

This invention relates to the field of heat sink and heat spreader structures and, more particularly, to heat sink/spreader structures which utilize thermoelectric effects to more efficiently dissipate thermal energy from electronic devices including Integrated Circuit (IC) devices and their associated packaging.

DESCRIPTION OF THE RELATED ART

The performance levels of microelectronic devices (e.g., integrated circuits, power amplifiers) are continually increasing to keep pace with the demands of modern technology. Performance levels such as clock speed are closely tied to the number and density of features (e.g., transistors) patterned onto the microelectronic device. Faster processing by the microelectronic device demands faster clock speeds. Faster clock speeds, in turn, mean more switching and power dissipation per unit time.

Sub-micron transistors and other features are currently patterned onto silicon wafers with extremely high densities. For example, several million transistors can be patterned on a single square centimeter of silicon. Switching speeds as fast as a few nanoseconds can be achieved with each transistor.

In theory, the performance levels of microelectronic devices should continually improve as the size of the transistors is decreased and the density of the features is increased. In practice, however, small, closely packed features dissipate large amounts of heat which limit performance levels. Heat is often dissipated from small, select regions of the device typically by heat sinks.

Temperature control has thus emerged as the limiting factor in the design of microelectronic devices. New-age devices, such as high-power amplifiers and multi-chip modules, radiate particularly large amounts of heat. Failure to effectively conduct away heat leaves these devices at high operating temperatures, ultimately resulting in decreased performance and reliability.

Heat sinks are most efficient when there is a uniform heat flux applied over the entire base. "Spreading resistance" occurs when a heat sink with a large base-plate area is attached to a heat source of a smaller footprint area. This results in a higher local temperature at the location where the heat source is placed. The spreading resistance is directly influenced by the following variables:

Footprint or contact area of the heat source;
Footprint area of the heat sink base-plate;
Thickness of the heat sink base-plate;
Thermal conductivity of the heat sink base-plate;
Average heat sink thermal resistance;
Location of the heat source relative to the base-plate center point.

The typical approach to overcoming spreading resistance is to increase the size of the heat sink, increase the thickness of the base, increase the airflow across the heat sink, or decrease the incoming air temperature. These steps increase weight, noise, system complexity and expense. When a solution cannot be achieved, the impact can be lost profits due to reduced electronics' performance, decreased reliability due to high operating temperatures, increased fan speeds and delays in new product introductions while thermal issues are resolved.

To improve the thermal performance of an electronics or integrated circuit device, heat sinks and heat spreaders are added either internally or externally to the packages. However, the typical materials utilized exhibit a variety of shortcomings including: thermal expansion mismatch between the heat spreader and the chip, excessive weight, high cost and marginal thermal performance.

U.S. Pat. No. 5,229,327, granted to Farnworth on Jul. 20, 1993 discloses structures to cool semiconductor devices with Peltier junctions. Electric current is passed through the Peltier junctions and semiconductor device (both in series) via a heat sink acting as an electrical bus and mechanical support. In addition, layers of metal and semiconductor material are progressively layered upon a semiconductor die (over a passivated layer) and junctions formed to yield peltier cooling. Power to the Peltier junctions (positive and negative terminals) is provided through the semiconductor die.

U.S. Pat. No. 5,637,921, granted to Burward-Hoy on Jun. 10, 1997 relates to a cooled electronic component package in which a single or multistage thermoelectric device contacts an integrated circuit chip via a cold plate. The chip and thermoelectric device are located within a sealed component package cavity in order to cool the chip to sub-ambient temperatures without condensation.

U.S. Pat. No. 5,714,791, granted to Chi, et al. on Feb. 3, 1998 discloses a micromachined Peltier device in which a silicon substrate is doped from one face to yield thin P and N-type thermoelements on top of a thin silicon membrane. The cold junctions of the thermoelements are located above a cavity (aperture) to minimize thermal conduction through the silicon substrate.

U.S. Pat. No. 6,196,002, granted to Newman, et al. on Mar. 6, 2001 relates to a ball grid array (BGA) integrated circuit package containing a thermoelectric device cooling the IC chip. Power for the thermoelectric cooler is supplied by the BGA package via conductive contacts. The thermoelectric cooler is positioned partially within the package substrate and one face (which contacts the IC chip) is cooler than the opposite thermoelectric face.

U.S. Pat. No. 5,569,950, granted to Lewis, et al. on Oct. 29, 1996 relates to a device to monitor and control the temperature of IC chips with a thermoelectric cooler and thermocouple sensing. A thermocouple, placed between the chip and thermoelectric cooler, provides feedback to regulate power to the cooler.

U.S. Pat. No. 5,598,031, granted to Groover, et al. on Jan. 28, 1997 discloses an IC package whereby the IC chip is mounted to a separate silicon substrate (larger in surface area than chip) in order to provide heat spreading via thermal conduction. Additionally, electrical pads and circuit traces are disposed onto the substrate surface (over an oxide layer) in order to provide electrical connection between the IC chip and package.

U.S. Pat. No. 5,837,929, granted to Adelman on Nov. 17, 1998 discloses a thermoelectric device and fabrication method in which a doped semiconducting substrate contains oppositely doped regions thereby creating positive and negative type thermoelements. These vertically oriented thermoelements are electrically isolated by etching spaces and filling the spaces with a polyimide material.

U.S. Pat. No. 4,211,888, granted to Stein, et al. on Jul. 8, 1980 relates to a thermopile in a star-like pattern on top of a semiconductor substrate. One thermoelement type is formed by doping regions on the substrate and the dissimilar thermoelement type is a metal layer deposited over an oxide. The center junctions of the thermopile are heated by a source of thermal radiation to be measured.

U.S. Pat. No. 5,956,569, granted to Shiu, et al. on Sep. 21, 1999 relates to a thermoelectric cooler structure and fabrication method in which the cooler is formed on the backside of a semiconductor substrate. The thermoelements, perpendicularly oriented to the substrate, are fabricated by etching the substrate, depositing doped polysilicon layers, oxide insulating layers and metal contact layers.

U.S. Pat. No. 4,646,126, granted to Iizuka on Feb. 24, 1987 relates to a multiple IC chips mounted to a separate silicon substrate (via an oxide layer) and wiring layers interconnecting them.

U.S. Pat. Nos. 5,777,385 and 6,162,659, granted to Wu on Jul. 7, 1998 and Dec. 19, 2000 respectively disclose an electronic package structure in which a silicon heat spreader substrate is bonded to the backside to an IC chip via discrete, raised solder joints.

U.S. Pat. No. 5,032,897, granted to Mansuria, et al. on Jul. 16, 1991 discloses an integrated circuit package in which the IC chip is bonded to a thermoelectric cooler (thermoelements oriented perpendicular to the IC chip) and positioned within the package cavity.

U.S. Pat. No. 6,222,113, granted to Ghoshal on Apr. 24, 2001 relates to a thermoelectric cooler whose thermocouples are mounted to a doped semiconducting substrate with discrete conductive regions corresponding to each electrical interconnection member connecting both thermoelement types. Power is thereby supplied to the thermoelectric cooler's thermocouples (mounted between the two substrates) via both substrates.

U.S. Pat. No. 6,094,919, granted to Bhatia on Aug. 1, 2000 relates to an IC package whose lid contains an integrated thermoelectric cooler comprising thermoelements oriented perpendicularly to the lid and IC chip.

U.S. Pat. No. 5,061,987, granted to Hsia on Oct. 29, 1991 discloses an electronic package comprising a silicon substrate to which an IC chip is bonded. Electrical pads and circuit traces are disposed to the faces of the substrate and conductive vias are formed (through doping) to electrically connect both substrate faces. Additionally, a silicon cover is hermetically sealed to the substrate.

U.S. Pat. No. 4,092,614, granted to Sakuma, et al. on May 30, 1978 discloses a semiconductor laser in which a silicon crystal body is sandwiched between a metal body and semiconductor laser crystal body thereby providing a thermal and electrical path through the entire sandwich.

U.S. Pat. No. 6,091,142, granted to Lee on Jul. 18, 2000 relates to a stacked semiconductor package in which multiple IC chips are mounted between and supported by becker and cap structures. Additionally, one heat sink is mounted to the wire bond pads and another is mounted under each chip, thereby requiring at least one heat sink per IC chip. Both heat sinks protrude from the becker and cap to radiate heat.

U.S. Pat. No. 5,051,865, granted to Kato on Sep. 24, 1991 discloses a stacked semiconductor structure in which a plurality of chip sets (each comprised of a heat plate sandwiched by two IC chips) are bonded and electrically interconnected. Bonding between chip and heat sink is accomplished through conductive paste or solder in order for electrical power to be transferred between components.

U.S. Pat. No. 4,698,662, granted to Young, et al. on Oct. 6, 1987 relates to a multichip module is in which IC chips are dielectrically bonded to a silicon substrate which, in turn, is dielectrically bonded to a heat sink. Electrical conductive traces are deposited onto the substrate's surface to provide electrical connection between the chips and package pins.

Now, the field of Thermoelectricity relates to the thermodynamic effects of temperature differentials, electric potential gradients and current flow in single and multiple dissimilar electrical conductors or semiconductors. There are basically three effects which comprise this field including: the Seebeck Effect, the Peltier Effect and the Thomson Effect.

In 1821, Seebeck found that when two dissimilar conducting or semiconducting materials are joined to each other at both ends and if there is a temperature differential between these two ends, an EMF, or voltage, will be established within the two materials. This effect is called the Seebeck Effect. The effect arises because the presence of a temperature gradient in a material causes a carrier-concentration gradient and an electric field is established which causes the net flow of charge carriers when the conductors are joined into a closed electrical circuit.

In 1834, Peltier observed that heat was either liberated or absorbed at the junction of two dissimilar conductors or semiconductors when an electric current was passed through the junction. Measurements established that the rate of absorption or liberation of heat at the junction was directly proportional to the electric current. The effect arises because the potential energy of the charge carriers is in general different in the two conductors and also because the scattering mechanisms that govern the equilibrium between the charge carriers and the crystal lattice differ in the two conductors. Therefore, in order to maintain a conservation of energy as well as a conservation of charge when charge carriers move across the junction, energy must be interchanged with the surroundings of the junction. As in the case of the Seebeck Effect, the Peltier Effect cannot be ascribed to either material alone but rather is a consequence of the junction.

In 1857, Thomson found that an energy interchange with the surroundings took place throughout the bulk of a conductor if an electric current was allowed to flow while a temperature gradient existed in the conductor. The rate of energy absorbed or liberated per unit length was proportional to the product of the electric current and the temperature gradient. The reasons for the existence of the Thomson Effect are essentially the same as those that cause the Peltier Effect. However, the difference in the potential energy of the charge carriers and in the scattering mechanisms are the consequences of the temperature gradient and not of the inhomogeneities in the conductor.

Additionally, charge carriers which flow (induced by a voltage) from one region of any conductive or semiconductive material to another carry with them small quantities of heat energy. If the carriers originally at one temperature in the conductor are displaced to cooler surroundings, they must discharge their excess kinetic energy by collisions with the lattice, thereby maintaining a conservation of energy. This process assists the normal thermal conduction of heat energy in the conductor, which would occur in the absence of charge carrier (electric current) flow.

By combining the electric charge induced (active) heat transfer mechanisms created by the thermoelectric effects with the thermal conduction/radiation (passive) heat transfer mechanisms of typical heat sink/heat spreader structures, a more effective heat management structure is produced.

SUMMARY OF THE INVENTION

Accordingly, it is the overall object of the present invention to develop and construct heat dissipating IC device structures which utilize thermoelectric effects in order to more effectively transfer thermal energy from electronic circuitry.

One object of the present invention is to provide a heat dissipating IC device structure in which the silicon substrate itself is part of a thermoelectric couple, which may have an external electric potential applied.

An additional object of the present invention provides a heat dissipating IC device structure comprising a thermoelectric couple with elements connected together at both ends. When subjected to a temperature gradient, an EMF and corresponding current is established within the couple resulting in the absorption and liberation of heat at these junctions without the need for external electrical power.

Another object of the present invention is to provide a heat dissipating IC device structure, comprising of simply an electrically conductive or semiconductive material, wherein the material has an external electric potential applied in order to induce multiple heat transfer effects through the structure.

Yet, another object of the present invention is to provide the thermoelectric couple or conductive material of the heat dissipating IC device structure in electrical series with an external electric load such as an electronic component or other thermoelectric device.

Again, another object of the present invention is to provide the thermoelectric couple or conductive material of the heat dissipating IC device structure as a resistive load for an electronic component or power supply circuit in order to reduce electrical power consumption of the system.

Still, another object of the present invention is to provide a heat dissipating IC device structure whereby the thermoelement couple, when subjected to a temperature gradient, provides electrical power to an external load.

A further object of the present invention is to provide unique methods of delivering electrical power to each thermoelement, conductor or substrate.

Another object of the present invention is to provide a heat dissipating IC device structure comprised of multiple thermoelectric couples, in a planar configuration.

Yet another object of the present invention is to have a cascaded, or multistage "planar" thermoelectric device structure wherein each successive stage is added to the horizontal plane.

A further object of the present invention includes a single or multistage heat sink/spreader, each stage consisting of at least one thermoelement couple, in which all thermoelements are formed within the IC device substrate through selecting doping techniques. Various electrical isolation techniques are additionally disclosed.

An additional object is to reduce the coefficient of thermal expansion mismatch between integrated heat spreaders and IC device structures.

Lastly, it is an object of the present invention is to combine all of these unique design aspects and individual fabrication techniques into effective and manufacturable heat dissipating IC device structures.

BRIEF DESCRIPTION OF THE DRAWINGS

FIGS. 9a through 9d illustrate an electrical series of dissimilar thermoelements integrated with (or attachable to) an IC device substrate whereby either power is applied to or generated by the structures.

DETAILED DESCRIPTION OF THE INVENTION

Described below are several embodiments of the present invention which illustrate various ways the present invention can be implemented. In the descriptions that follow, like numerals represent like elements in all figures. For example, where the numeral 10 is used to refer to a particular element in one figure, the numeral 10 appearing in any other figure refers to the same element.

Figure 1:
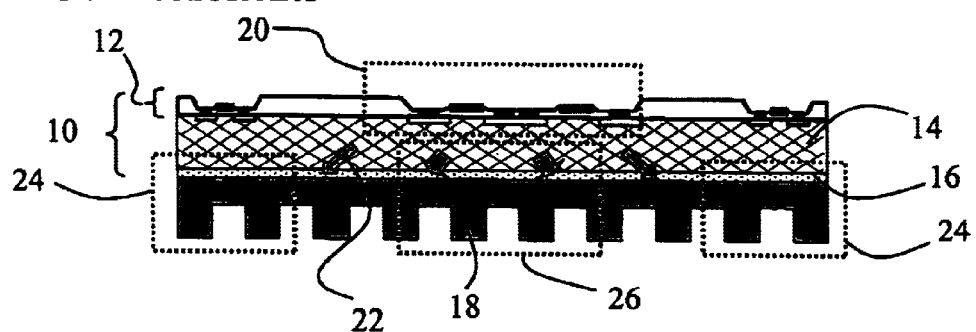
FIG. 1 is a pictorial representation illustrating conductive heat flow paths in a typical heat sink when interfaced with a heat source such as an electronic component.

As seen in FIG. 1 (sectional view), an integrated circuit (IC) device structure 10 is illustrated, which includes at least one chip, or die, comprising at least one circuitry layer 12 integrated with a semiconductor substrate 14.

A die (chip) is typically the individual semiconductor element or integrated circuit after it has been cut or separated out of the processed semiconductor wafer which is distinct from a completely packaged or encapsulated IC with leads attached. Comprised of the wafer material, the semiconductor substrate is the basic building block from which interconnected circuit elements (at least one circuitry layer) are associated and formed.

Some typical semiconductor substrate (wafer) materials include: silicon, silicon-germanium, silicon carbide, gallium arsenide and other organic and inorganic compound materials.

This IC device structure's 10 semiconductor substrate 14 is bonded (with a dielectric layer 16) to a heat sink 18 (comprised of a conductor or semiconductor) to dissipate excess thermal energy generated by the heat generating circuitry layer 12. Circuit architectures and the IC devices' thermal resistance usually result in a higher concentration of heat near the substrate center region 20. Due to the further densification of electronic device packages, the heat sink may be significantly larger in length and width than that of the heat source (circuitry) in order to dissipate enough heat per given time. As thermally conducted heat 22 moves outward from the substrate center region 20 (hot region) and through the heat sink 18, the sink perimeter regions 24 do not receive as much heat as the sink center region 26 immediately adjacent the substrate center region 20. As a result, thermal spreading resistance becomes a major limiting factor in the heat sink's ability to dissipate heat to the surrounding ambient environment.

Figure 2:
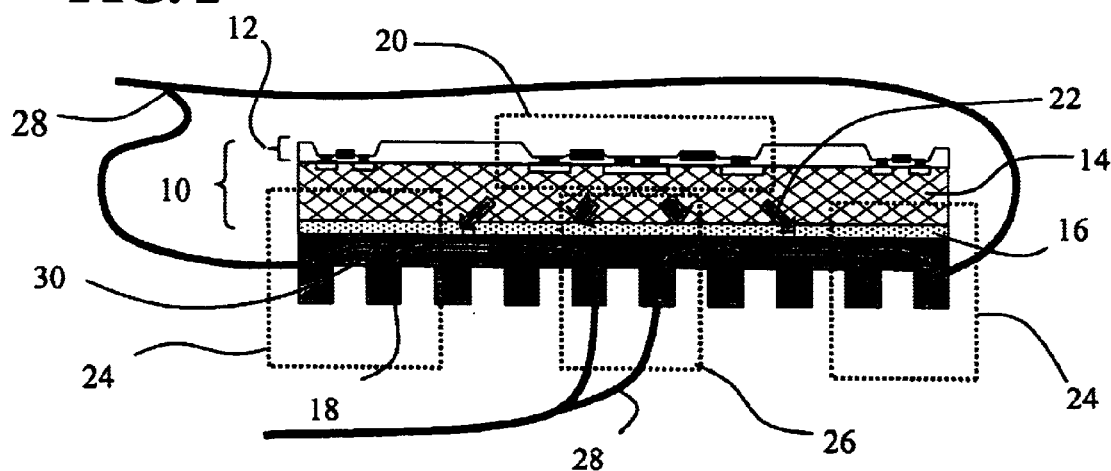
FIG. 2 illustrates the utilization of multiple heat transfer effects in the present invention.

FIG. 2 (sectional view) illustrates how an electrical conductor or semiconductor, carrying an electric current, can induce various heat transfer effects such as the Peltier Effect, Thomson Effect and the ability of charge carriers to carry thermal energy when under the influence of a voltage.

Similar to FIG. 1, the IC device structure 10, coupled to a heat sink 18 (via a dielectric bonding layer 16), again has a center region 26, which receives most of the thermally conducted heat 22 from the hotter substrate center region 20. In this example, however, an electric potential is applied (via power leads 28) across the heat sink 18 and charge carrier flow 30 (electron flow in metals, electron and hole flow in N and P-type semiconductors respectively) absorbs heat energy from the sink center region 26 and dissipates the heat to the sink perimeter regions 24, resulting in higher heat sink efficiency. This thermal anisotropy, or directional heat transfer, is more effective at removing thermal energy from a localized heat source than conventional materials such as metals.

Figure 3:
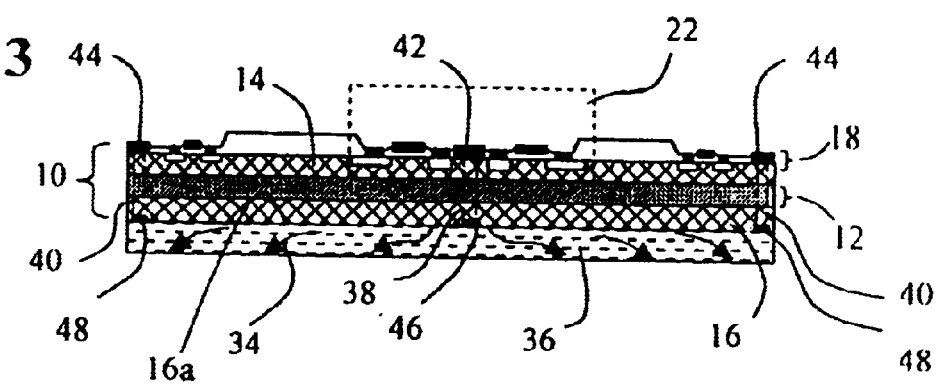
FIG. 3 illustrates active heat transfer paths resulting from an application of current in one embodiment of the present invention.

As shown in FIG. 3 (sectional view), the IC device structure 10 is attached to a conductive or semiconductive member 32 via the semiconductor substrate's backside 14a. In order to increase the heat transfer efficiency of the substrate 14, a dopant region 34 may be diffused into the semiconductor substrate's backside 14a to decrease its electrical resistance. The contact between the substrate and the doped region creates a electrically isolating transition or depletion layer 36 at the interface. Attachment may be achieved through the use of wafer bonding illustrated in FIGS. 7a through 7c resulting in either an electrically conductive or non-conductive attachment.

In this particular embodiment, electrically conductive vias 38, 40 (to provide power) connect the member 32 to contacts 42, 44 located within a portion of the circuitry layer 12. The resultant connection between the center via 38 and conductive member 32 creates a heat absorbing junction 46 near the center of the substrate. Likewise, the connections between the perimeter vias 40 and member 32 create heat rejecting junctions 48 near the perimeter of the substrate. Power supplied to the member 32 (via junctions 46, 48) induces charge carrier flow 30 and resultant heat transfer from the hotter substrate center region 20 (via the heat absorbing junction 46) outward (laterally) to the heat rejecting junctions 48 on the conductor's perimeter which is immediately adjacent to the substrate perimeter. Of course, the actual direction of charge carrier flow 30 (and therefore the determination of junction types) is dependant upon the voltage polarity as applied to the member 32 via junctions 46, 48.

Figure 4:
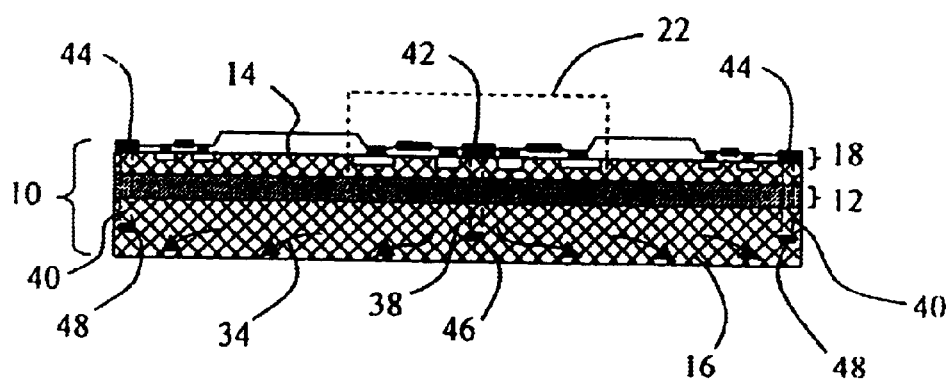
FIG. 4, another embodiment of the present invention, illustrates a means of supplying power to the heat dissipating structure.

FIG. 4 (sectional view) differs from FIG. 3 in that the doped region 34 (diffused into the semiconductor substrate's backside 14a to decrease its electrical resistance) within semiconductor substrate 14 is provided with a voltage (through the vias 38, 40) from a portion of the circuitry layer 12 thereby inducing charge carrier flow 30 to move heat from the hotter substrate center region 20 toward the substrate 14 perimeter. The contact between the substrate 14 and the doped region 34 creates a electrically isolating transition or depletion layer 36 at the interface.

Figure 5A:
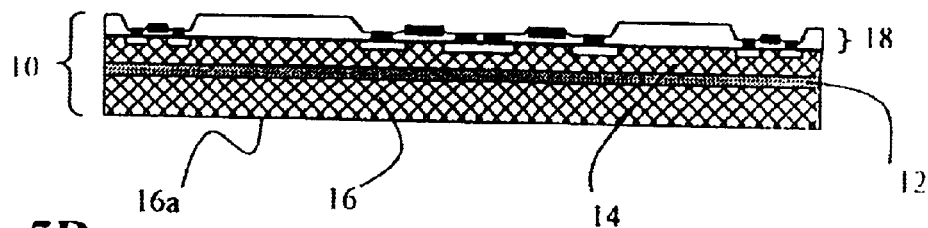
FIGS. 5a through 5c illustrate one method of fabricating thermoelement couples onto an IC device substrate.
Figure 5B:
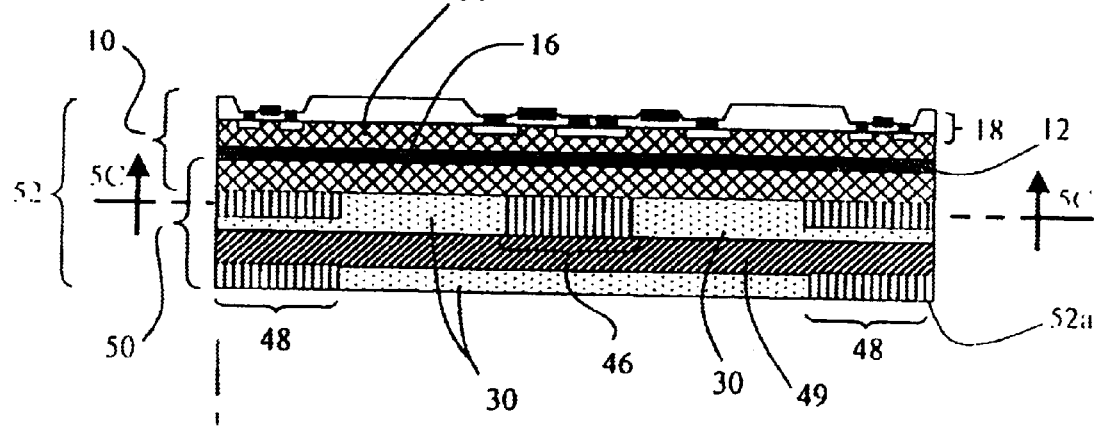
Figure 5C:
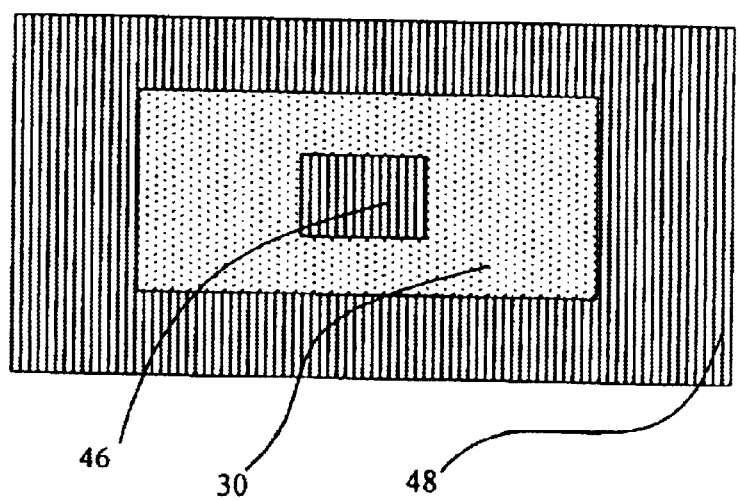

FIGS. 5a through 5c demonstrate the process flow for the fabrication of a heat dissipating IC device structure of the present invention.

Seen in FIG. 5a, an IC device structure 10 (sectional view) is comprised of similar components seen in previous figures.

In FIG. 5b, an electrical conductor or semiconductor 49 (dissimilar in composition to the semiconductor substrate 14) is bonded to the semiconductor substrate 14 via a heat absorbing junction 46 and a heat rejecting junction 48, both junction types 46, 48 laterally positioned relative to each other. The heat absorbing junction 46 (located near the center of the silicon substrate) and the heat rejecting junction 48 (located near the perimeter of the silicon substrate) may be comprised of a conductive material or the same material as the semiconductor 49. The substrate 14, adjacent the junctions 46, 48, may (at least partially) be additionally doped (creating a doped region 34) in order to further increase electrical conductivity. The contact between the substrate and the doped region creates a depletion layer 36 at the interface.

The addition of junctions 46, 48 bonding the semiconductor 49 to the semiconductor substrate 14 (creating a thermoelement couple) results in a heat sink/spreader structure 50. The integration of this structure 50 with the IC device structure 10 thereby yields an efficient heat dissipating IC device structure 52.

In order to maintain planarity of the structure's backside 52a and to mitigate thermal resistance between the structure and external heat sink, a dielectric layer 16 is added between the junctions 46, 48. Additionally, the junctions 46, 48 may be embedded (flush) in the substrate 14, eliminating the need for the dielectric.

FIG. 5c (a sectional view of FIG. 5b on lines 5c—5c) illustrates the bottom view of the heat absorbing junction 46 and heat rejecting junction 48 with the dielectric layer 16 interdispersed on the doped region 34 of the silicon substrate 14. With the application of a voltage across the thermoelement couple, thermal energy will be transferred from the heat absorbing junction 46 (located in the center of the substrate 10) laterally through the substrate 14 and semiconductor 49 and dissipated at the heat rejecting junctions' 48 regions located around the entire perimeter. Electric power connections (not shown) to both junctions 48 can include internal vias (connecting a portion of the circuitry layer to the substrate 14) or external leads.

FIGS. 6a through 6e illustrate another heat dissipating IC device structure of the present invention.

Figure 6A:
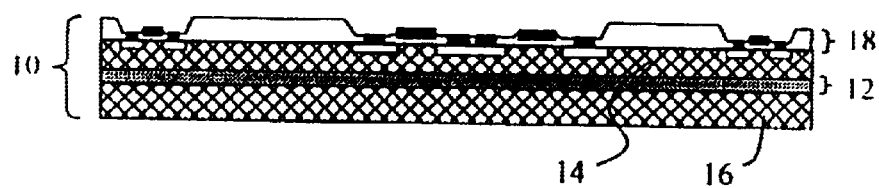
FIGS. 6a through 6c illustrate another method of fabricating the present invention.

As seen in FIG. 6a, an IC device structure 10 is comprised of similar components seen in previous figures.

Figure 6B:
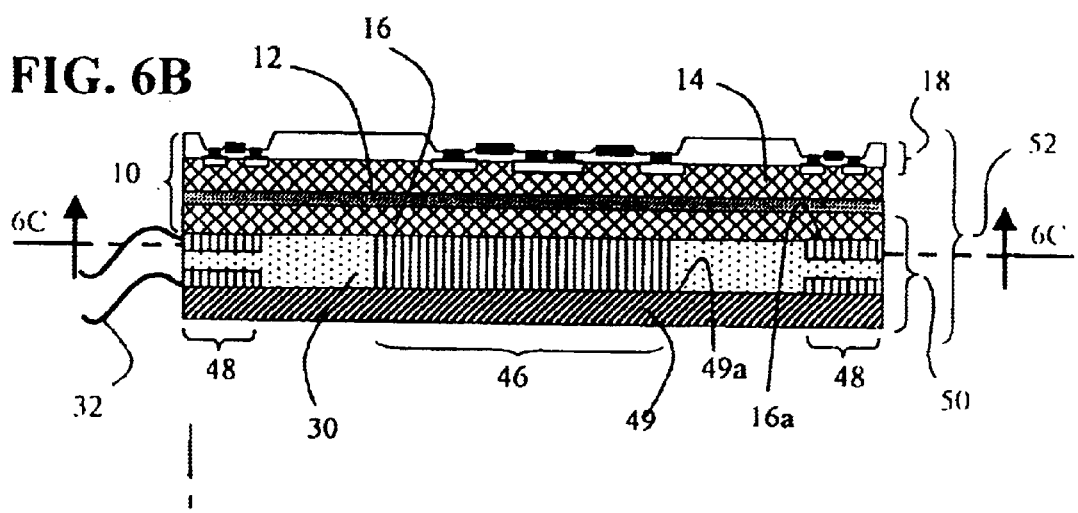

FIG. 6b comprises a dissimilar conductive or semiconductive thermoelement (comprised of at least one layer) 49 electrically bonded at a heat absorbing junction 46. Additionally, a dielectric layer 16 is selectively deposited over the opposing faces 10a, 49a of the IC device structure 10 and semiconductor 49 and their heat rejecting junctions 48 thereby providing a thermal bond between the structure 10 and semiconductor 49.

Figure 6C:
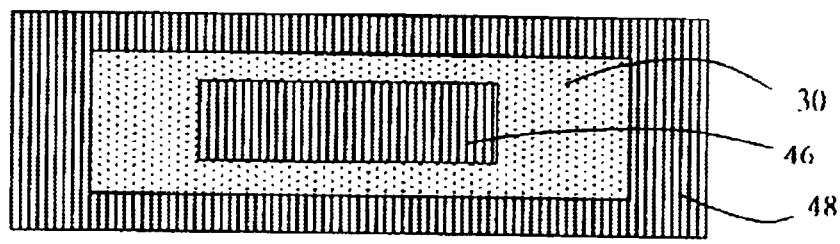

Within FIG. 6c (a sectional view of FIG. 6b on lines 6c—6c) the heat absorbing junction 48 (electrically bonding both the substrate 14 and semiconductor 49) is positioned near the center of the substrate 14 (center of the IC device structure 10) and the heat rejecting junction 48 (representing the heat rejecting junctions on the substrate 14 and semiconductor 49) is positioned near the perimeter of the substrate 14 and IC device structure 10.

Figure 7A:
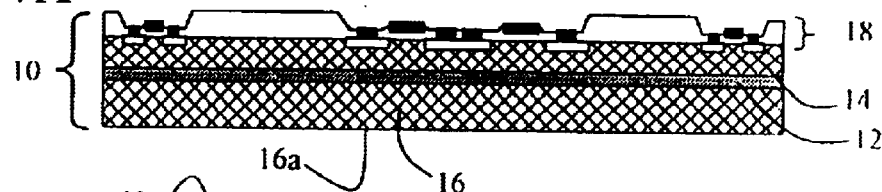
FIGS. 7a through 7c illustrates a method of manufacture involving wafer bonding of a heat dissipating structure to a IC device.
Figure 7B:
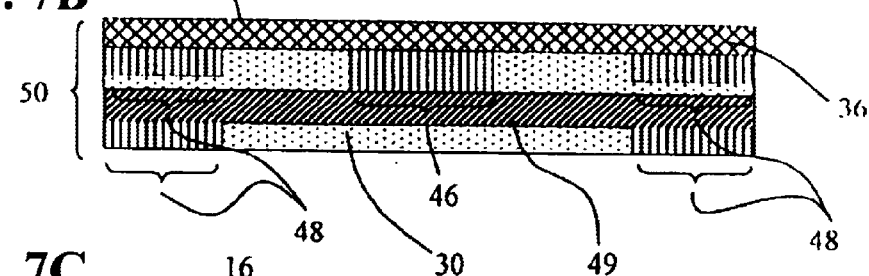
Figure 7C:
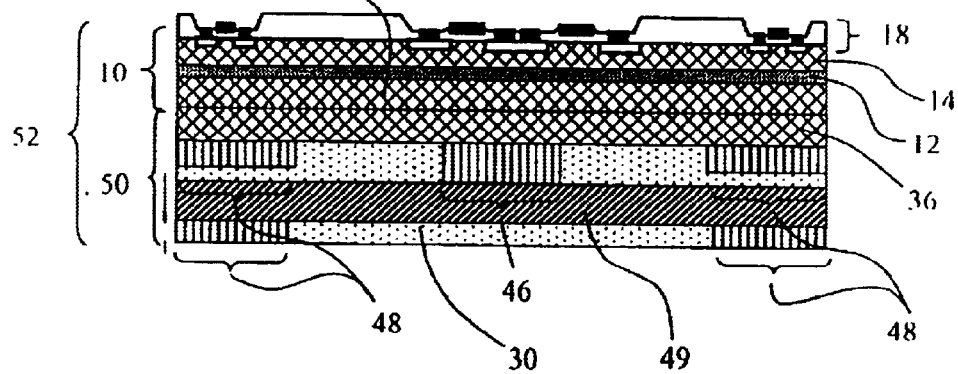

FIGS. 7a through 7c illustrate the wafer bonding of a IC device structure 10 to a discrete heat sink/spreader structure 50 in order to create a heat dissipating IC device structure 52 of the present invention.

FIG. 7a illustrates a typical IC device structure 10 seen in previous figures.

FIG. 7b depicts a heat sink/spreader structure 50 (similar in composition to the structure 50 seen in FIG. 5b) wherein a thermoelement couple is created through the bonding (at a heat absorbing junction 46) between a conductor or semiconductor 32 (preferably silicon) to at least one dissimilar conductor or semiconductor 49. The dissimilar conductors comprise at least one heat rejecting junction 48 each located near the perimeter of the structure 50.

In the embodiment seen in FIG. 7c, the face 50a (of the structure 50 opposite the junctions 46, 48) will be wafer bonded to the exposed face 14a of the semiconductor substrate 14 (seen in FIG. 7a) to yield a heat dissipating IC device structure 52 seen in FIG. 7c. Depending upon which wafer bonding technique is employed, the bond may yield either an electrically conductive or non-conductive attachment. Additionally, a depletion region may also result at the bond line (between faces 14a and 50a) as a result of carrier type/concentration differences.

There are several wafer bonding techniques that can be used to achieve different bonds. These can be classified as anodic, direct, or intermediate-layer bonds. The last category includes eutectic and glass-frit bonds. The general process of wafer bonding can be summarized as a three-step sequence: surface preparation, contacting, and annealing.

Wafer bonding in the present invention may utilize, but is not limited by the specific techniques disclosed.

Anodic bonding relies on charge migration to produce bonded wafers. This usually involves a silicon wafer and a glass wafer or layer with a high content of alkali metals. In this approach, the presence of mobile metals is exploited by applying a high negative potential to the glass to attract the positive ions (Na+) to the negative electrode, where they are neutralized. The bond is performed at temperatures of up to 500° C., which increases the mobility of the positive ions. Furthermore, driven by the existing electric field, oxygen from the glass is transported to the glass-silicon interface where it combines with silicon to form SiO2, which creates a permanent bond.

Silicon direct wafer bonding (DWB), also known as fusion bonding, is performed by joining two silicon wafers together. This is done by creating hydrophobic or hydrophilic surfaces that are brought into contact and annealed at high temperatures. The bond is originated by pressing in the middle of one of the wafers to create an initial point of contact while mechanical spacers keep the wafers physically separated. Subsequent heating dehydrates the surface and causes a number of processes to take place. The hydroxyl groups form water molecules that in turn promote the oxidation of the bonding surfaces, creating a Si—O—Si bond as the hydrogen diffuses away.

In eutectic and glass-frit bonding, intermediate films are deposited before the bond; these are metallic in the former case and glass in the latter. The alloy is formed by solid-liquid interdiffusion at the interface, followed by solidification upon cooling. Pressure is applied while the wafers are maintained at the appropriate temperature.

With Glass-frit bonding, a thin glass layer is deposited and preglazed. The wafers are then brought into contact at the rated melting temperature of the glass, which is always <600° C. Pressure is also applied to keep the samples in intimate contact.

Any one of the techniques mentioned is capable of creating the resultant heat dissipating IC device structure 52 seen in FIG. 7c and many other illustrated embodiments of the present invention.

Figure 8:
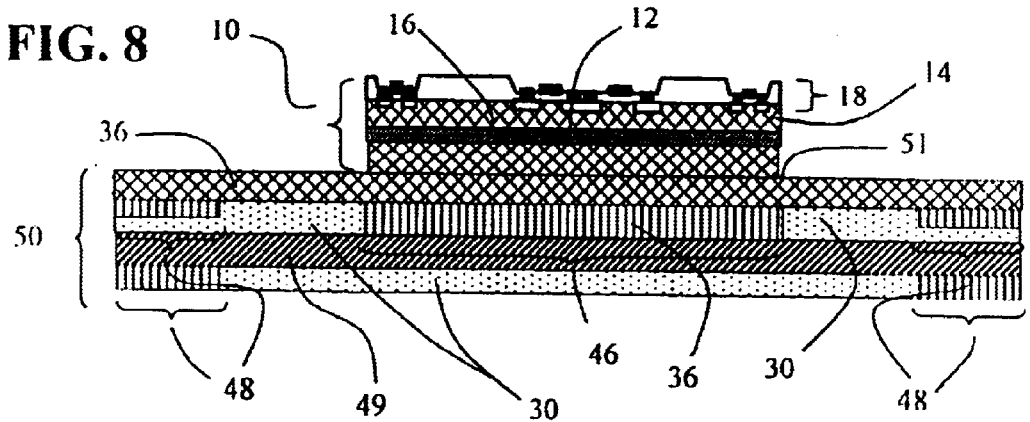
FIG. 8 illustrates another embodiment of the present invention utilizing wafer bonding.

FIG. 8, similar to the heat dissipating structure 52 (seen in FIG. 7c), utilizes a heat sink/spreader structure 50 whose surface area is larger than that of the IC device structure 10 it is wafer bonded to. It can be seen that the heat absorbing junction 46 surface area and location correlates with that of the bonded IC device structure 10. However, the heat rejecting junctions 48 are located outside the bond line 54 between the spreader structure 50 and IC device structure 10. As previously discussed, a large heat load may require additional surface area of the heat sink to dissipate enough thermal energy. The increased surface area of the spreader structure 50 will boost the dissipating efficiency of a coupled heat sink (not shown) by effectively moving heat laterally over a larger area. Depending upon which wafer bonding technique is employed, the bond line 54 may yield either an electrically conductive or non-conductive attachment. Additionally, a depletion region may also result at the bond line 54 as a result of carrier type/concentration differences.

FIGS. 9a through 9d illustrate a heat dissipating IC device structure comprising multiple thermoelement couples electrically in series. It can also be seen that the thermoelement couples can be supplied power (to move heat) or generate power from any difference in temperature between the heat absorbing junctions 46 and heat rejecting junctions 48.

FIG. 9a, a sectional view of FIG. 9c on lines 9a—9a, depicts a IC device structure 52 in which the substrate 14 is selectively doped with P-type and N-type dopants to form a continuous alternating pattern of P-type and N-type conductive thermoelements 56, 58 around a small via 60. The thermoelements 56, 58 are electrically bonded (through the use of an additional conductor or by directly bonding each P and N-type thermoelement together) thereby forming thermoelement couples with the heat absorbing junctions 46 near the center of the substrate and heat rejecting junctions 48 near the perimeter. Electrical isolation may be provided by the depletion regions 36 established between the substrate 14 and each doped discrete thermoelement 56, 58.

The bottom view seen in FIG. 9b clearly illustrates the distinctive dissimilar P-type and N-type thermoelements 56, 58 and small via 60 (in the substrate 14) necessary to achieve the pattern of thermoelement couples. A dielectric, such as an oxide or nitride, may be added to the physical regions between each P and N-type conductive thermoelement 56, 58. Additionally, the physical regions between each P and N-type thermoelement 56, 58 may be removed (chemically or mechanically) in order to provide electrical insulation between each thermoelement.

Within FIG. 9c (bottom view), the heat absorbing junctions 46 and heat rejecting junctions 48 are visible along with leads 28 making an electrical connection to a power source 62. The structure 52 may also be electrically in series with an electrical load other than itself, such as an integrated circuit or other electronic component. In this way, the electrical current draw by both the electronic component and structure 52 will be interconnected. As the heat source demands more current, more heat must be removed and thus, the heat dissipating IC device structure 52 (electrically in series) will also receive additional current, which will increase heat transport capacity. Any embodiment of the present invention may be connected electrically in series with another load, such as the embodiment illustrated here in FIG. 9c.

In another embodiment of the present invention, the power requirement of the heat dissipating IC device structure 52 can be augmented by utilizing its own internal electrical resistance as a resistive load for an electronic component or power supply circuit. In one example, voltage positioning is utilized by some CPU circuits to reduce power consumption. The CPU's core voltage, reduced as the power load increases, is controlled with power supply ICs which implement a droop resistor. This low ohmic value resistor, placed in the load's (CPU) path, consumes some of this power thereby reducing power efficiency of the system. By combining the power requirements of both the droop resistor and the heat dissipating structure 52, CPU power can be reduced and heat generated by the integrated circuitry can dissipated efficiently. Any embodiment of the present invention may utilize its own internal electrical resistance as a resistive load, such as the embodiment illustrated here in FIG. 9c.

Lastly, FIG. 9d (bottom view) depicts the heat dissipating structure 52 in which the leads 28 deliver power generated by the thermoelement couples to an external load 64 for consumption. As described in the background, a temperature differential experienced between the heat absorbing junctions 46 and heat rejecting junctions 48 of the structure 52 will generate a voltage (open or closed circuit) and corresponding current when connected to the external load 64. Any embodiment of the present invention may generate electrical power and deliver it to an external load, such as the embodiment illustrated here in FIG. 9d.

Figure 10A:
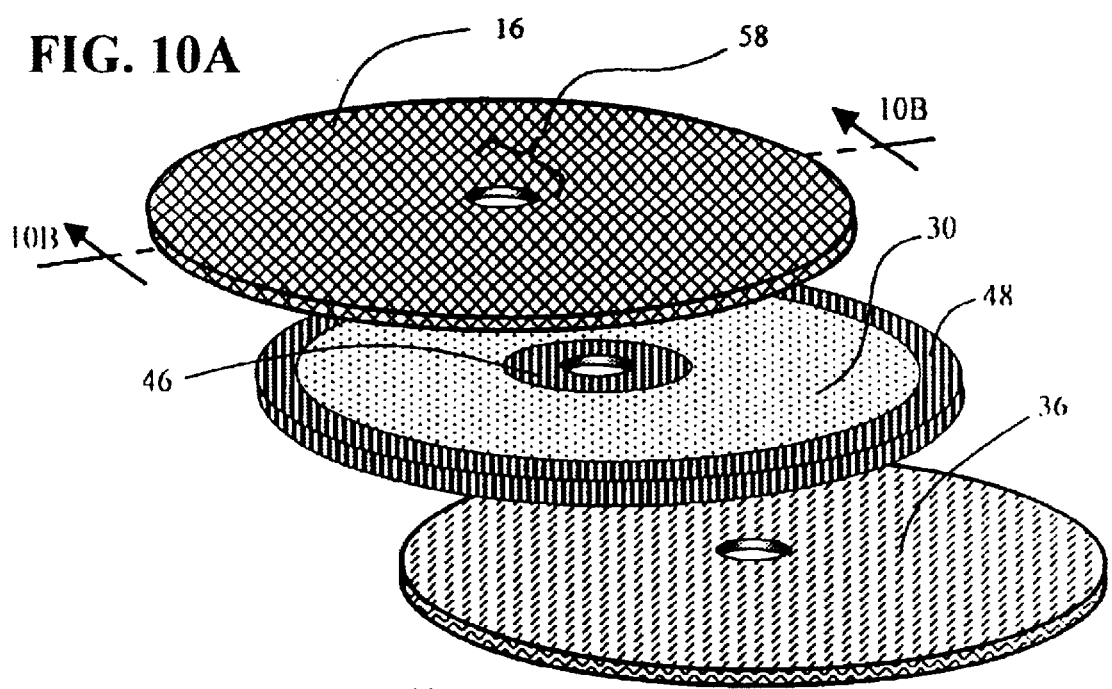
FIGS. 10a through 10c illustrate a closed circuit thermoelectric couple as one embodiment of the present invention.
Figure 10B:
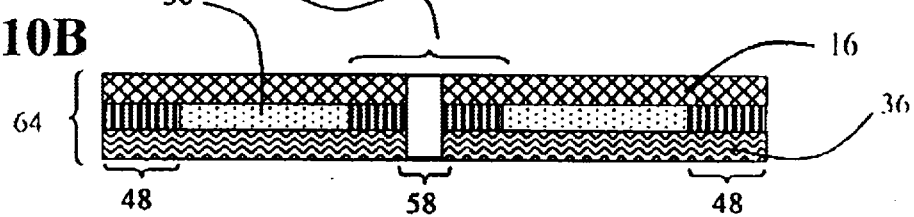
Figure 10C:
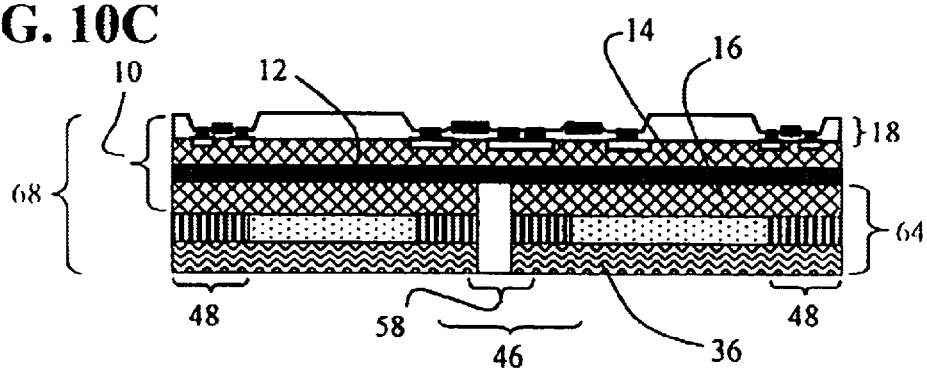

The embodiment in FIGS. 10a through 10c illustrate a multistage (or cascaded, structure including thermoelement couples thermally in series with each other) heat dissipating IC device structure comprising a thermoelement couple which is neither connected to a power source or external load.

Within FIG. 10a, the doped region 34 of the semiconductor substrate 14 portion (IC device structure 10 seen in FIG. 10c) is shown separately for clarity purposes. A heat absorbing junction 46 (near center of substrate), heat rejecting junction 48 (near perimeter of substrate) and dielectric layer 16 are (shown together also for clarity) all sandwiched between and bonded to the doped region 34 of the substrate 14 and a conductor or semiconductor layer 32. A small open via 60 (which may be dielectrically filled) facilitates the electrical isolation between the heat absorbing junction 46 and heat rejecting junction 48 when bridged by the substrate's doped region 34 and conductor 32.

The resultant structure, seen in FIG. 10b, illustrates how the semiconductor substrate's doped region 34 and conductor 32 are electrically bonded to each other at both junctions 46, 48, thus creating a closed circuit thermoelement couple structure 64.

Now, according to the Seebeck Effect, if two dissimilar thermoelements are electrically joined to form two junctions, and if the temperature of each junction differs, a voltage and corresponding current will be developed. The actual electric "load" is the resistance of the heat rejecting junction 48. The resulting generated electric current will absorb heat via the Peltier Effect (at the heat absorbing junction 46) and transport it to the heat rejecting junction 48 where it will be dissipated.

FIG. 10c illustrates the complete heat dissipating IC device structure 66 comprising the closed circuit thermoelement couple structure 64 integrated with the semiconductor substrate 14 within the IC device structure 10. The contact between the substrate 14 and the doped region 34 (diffused into the semiconductor substrate 14 backside) creates a electrically isolating depletion layer 36 at the interface.

Figure 11A:
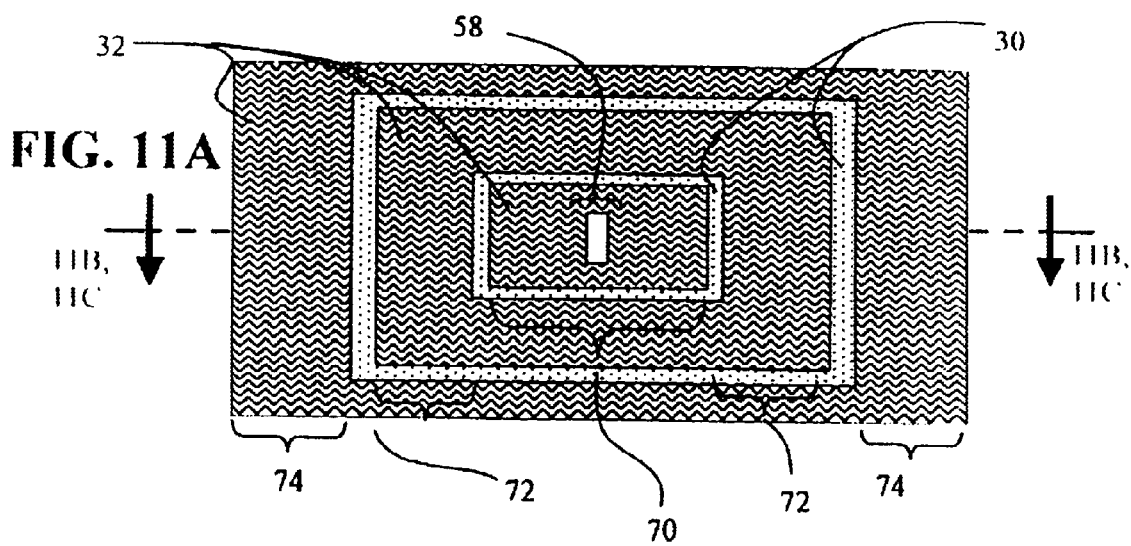
FIGS. 11a through 11c illustrate a single semiconducting thermoelement with multiple cascaded stages.
Figure 11B:
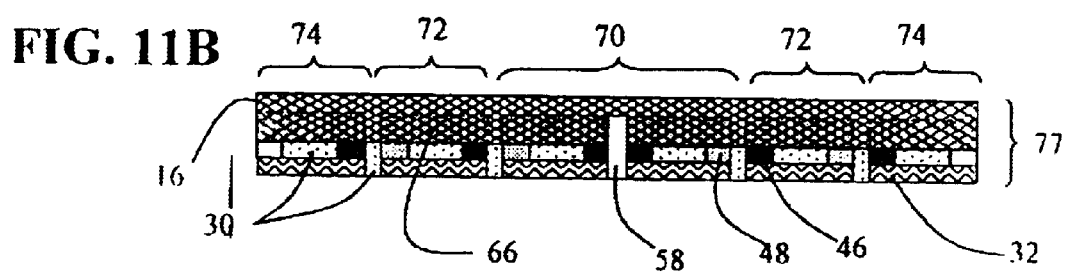
Figure 11C:
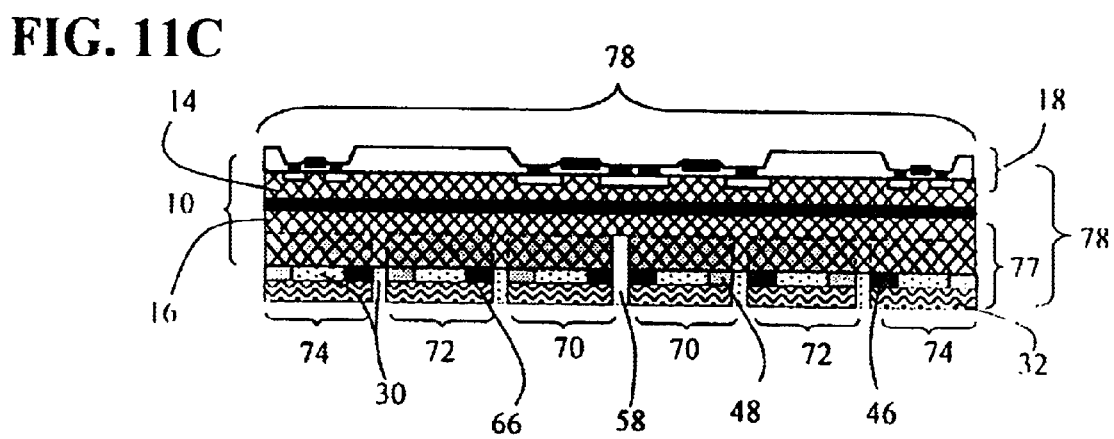

FIGS. 11a through 11c illustrate a multistage (or cascaded, structure including thermoelement couples thermally in series with each other) heat sink/spreader structure, integrated with an IC device structure, wherein each stage comprises at least one thermoelement couple with at least one heat absorbing junction 46 near each stage center and heat rejecting junction 48 near each stage perimeter.

FIG. 11a illustrates the bottom view of the structures seen in FIGS. 11b and 11c.

Reference is now made to FIG. 11b (a sectional view of FIG. 11a on lines 11b—11b) wherein multiple regions (comprising individual stages each with one thermoelement couple) within the semiconductor substrate 14 are doped (thereby creating a depletion layer 36) to yield discrete thermoelements 68 with three isolated thermoelement stages 70, 72, 74. The thermoelements 68 (in each stage 70, 72, 74) are joined with a conductor or semiconductor 32 (at the heat absorbing and heat rejecting junctions 46, 48) to yield a closed circuit structure also depicted in FIGS. 10a through 10c. A small open via 60 (which may be dielectrically filled) facilitates the electrical isolation (within stage 70) between the heat absorbing junction 46 (located near the center of each thermoelement 68, 32) and heat rejecting junction 48 (located near the perimeter of each thermoelement 68, 32) when bridged by the thermoelement 68 and dissimilar conductor 32.

It can be seen that each successive stage 70, 72, 74 is laterally displaced from the previous stage (positioned outside an entire perimeter of the previous and successive stage) and the center of the structure 10. Electrical isolation may be provided by depletion regions established between the silicon substrate 16 and doped discrete thermoelements 68. Additionally, an oxide or nitride region electrically may isolate each discrete thermoelement 68 with stages 70, 72, 74 within the silicon substrate 14. In this embodiment, the entire substrate 14 may be doped (without separate regions) and electrically isolated by possibly implanting oxygen between each discrete thermoelement stage 70, 72, 74.

Finally, FIG. 11c (a sectional view of FIG. 11a on lines 11c—11c) depicts the complete closed circuit multistage heat dissipating IC device structure 78 (including the closed circuit multistage thermoelement couple structure 77) in which three thermoelement couple stages 70, 72, 74 are fabricated with the IC device structure's 10 silicon substrate 14.

FIGS. 12 through 15 illustrate various electronic component package types (but not limited to) which may be utilized to house the IC die comprising the heat dissipating IC devices in any embodiment of the present invention. The heat sink/spreader structures illustrated may be fabricated with the IC device's semiconducting substrate or the heat sink/spreader may be attached (via the substrate) with wafer bonding techniques disclosed in the previous figures.

Figure 12:
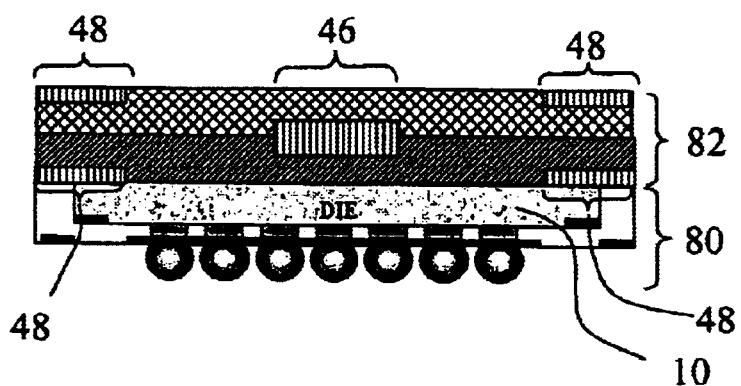
FIG. 12 illustrates a CSP electronic component package for housing the silicon substrate in the present invention.

FIG. 12 illustrates a Chip Scale Package (CSP) 80 including an IC die 10 attachable to or fabricated with a heat sink/spreader structure 82 (via the substrate) of the present invention. The heat absorbing junction 46, positioned near the center of the die 10 and package 82 transfers heat energy outward to the heat rejecting junction 48 which is located near the perimeter of the die 10 and package 82.

Figure 13:
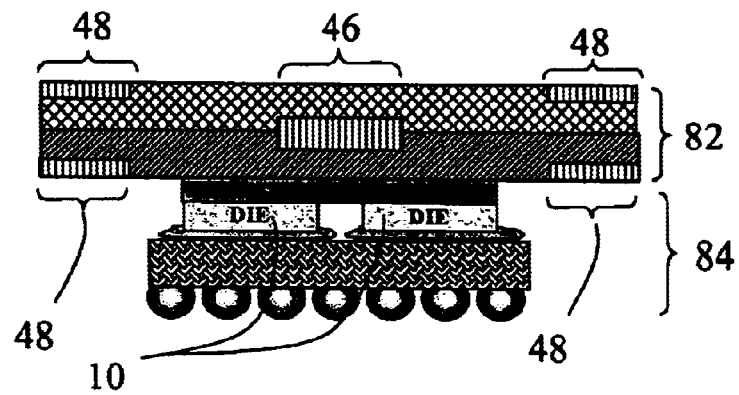
FIG. 13 illustrates a FCMCM electronic component package for housing the silicon substrate in the present invention.

FIG. 13 illustrates a Flip Chip Multi-Chip Module (FCMCM) package 84 wherein two IC dies 10 are attached to a heat sink/spreader structure 82 of the present invention.

Figure 14:
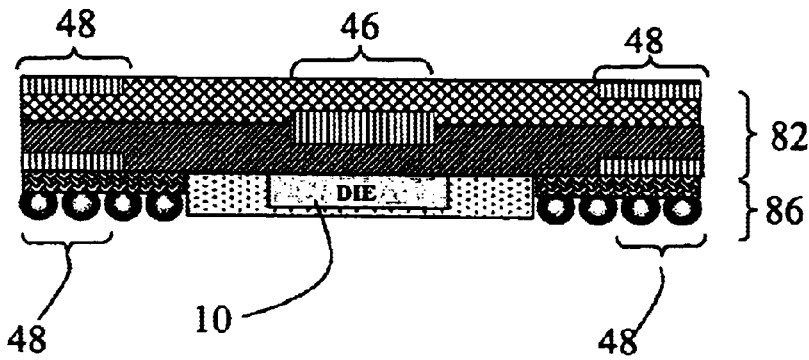
FIG. 14 illustrates a wire-bonded TBGA electronic component package for housing the silicon substrate in the present invention.

FIG. 14 illustrates a wire-bonded Tape Ball Grid Array (TBGA) package 86 in which a heat sink/spreader structure 82 comprises a cavity to which an IC die 10 is attached.

Figure 15:
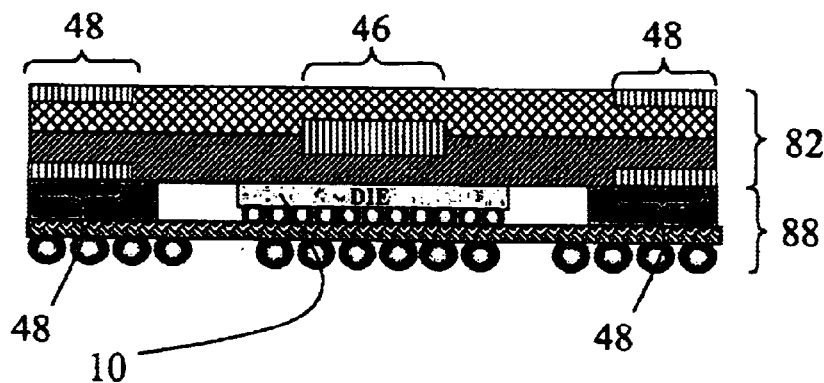
FIG. 15 illustrates a FCBGA electronic component package for housing the silicon substrate in the present invention.

FIG. 15 illustrates a Flip Chip Ball Grid Array (FCBGA) package 88 wherein the heat sink/spreader structure 82 (attachable to or fabricated from the IC die 10) transfers heat energy from the heat absorbing junction 46 to the heat rejecting junction 48.

Several embodiments of the present invention have been described. A person skilled in the art, however, will recognize that many other embodiments are possible within the scope of the claimed invention. For this reason, the scope of the invention is not to be determined from the description of the embodiments, but must instead be determined solely from the claims that follow.

What is claimed is:

1. A heat dissipating IC device comprising:
    at least one IC die comprising a semiconductor substrate including at least one circuitry layer with a hot region on at least one substrate face, a backside and a perimeter;
    a doped region diffused within the semiconductor substrate backside thereby creating a depletion layer between the substrate and doped region; and
    a voltage connected to the doped region, whereby the charge carrier flow, through the doped region of the substrate, travels in a direction from the hot region on the semiconductor substrate face outward toward the perimeter of the substrate face.

2. The device in claim 1 wherein an electric via connects a portion of the circuitry layer with the doped region within the semiconductor substrate in order to provide electrical power.

3. The device in claim 1 wherein the doped region within the semiconductor substrate is electrically in series with an electrical load other than itself.

4. The device in claim 1 wherein the doped region within the semiconductor substrate is utilized as a resistive load for an electronic component or power supply circuit.

5. A heat dissipating IC device comprising:
    at least one IC die comprising a semiconductor substrate including at least one circuitry layer with a hot region on at least one substrate face;
    at least one electrically conductive or semiconductive member attachable to the semiconductor substrate; and
    an electrical source connected to the electrically conductive or semiconductive member, whereby the charge carrier flow travels in a direction from the hotter region on the semiconductor substrate face outward toward the perimeter of the substrate face.

6. The device in claim 5 wherein an electric via connects a portion of the circuitry layer with the semiconductor substrate in order to provide electrical power to the electrically conductive member.

7. The device in claim 5 wherein the electrically conductive member is electrically in series with an electrical load other than itself.

8. The device in claim 5 wherein the semiconductor substrate is attached to the electrically conductive or semiconductive member by wafer bonding.

9. The device in claim 5 wherein the electrically conductive or semiconductive member is attached to more than one semiconductor substrate.

10. The device in claim 5 wherein the semiconductor substrate attachment to the conductive or semiconductive member is electrically conductive.

11. A heat dissipating IC device comprising:
    at least one IC die comprising a semiconductor substrate including at least one circuitry layer on at least one substrate face;
    at least one thermoelement couple, said couple comprised of the semiconductor substrate and at least one dissimilar conductor electrically bonded to the semiconductor substrate thereby creating junctions; and
    said thermoelement couple comprises at least one heat absorbing junction and at least one heat rejecting junction wherein the heat absorbing junction is positioned near the center of the substrate face and the heat rejecting junction is positioned near the perimeter of the substrate face.

12. The device in claim 11 wherein the semiconductor substrate, adjacent the junctions, includes a doped region thereby creating a depletion layer between the substrate and doped region.

13. The device in claim 11 wherein the dissimilar conductor comprises more than one layer.

14. The device in claim 11 wherein an electric via connects a portion of the circuitry layer with the semiconductor substrate in order to provide electrical power to the thermoelement couple junctions.

15. The device in claim 11 wherein a voltage is applied to the thermoelement couple.

16. The device in claim 11 wherein the thermoelement couple is electrically in series with an electrical load other than itself.

17. The device in claim 11 wherein the thermoelement couple is utilized as a resistor for an electronic component.

18. The device in claim 11 wherein a voltage and current is generated by the thermoelement couple and is consumed by an external electric load.

19. The device in claim 11 wherein the silicon substrate and dissimilar thermoelement, comprising each thermoelement couple, is electrically bonded to each other at both the heat absorbing and heat rejecting junctions thereby creating closed electrical circuit thermoelement couples.

20. A heat dissipating IC device including at least one IC die comprising a semiconductor substrate including at least one circuitry layer, the substrate attachable to a heat sink/spreader structure comprising:
    a heat sink/spreader structure wherein at least one thermoelement couple is created through the bonding between at least one semiconductor to at least one dissimilar conductor; and
    the dissimilar conductor comprises at least one heat absorbing junction and one heat rejecting junction wherein the heat absorbing junction is positioned near the center of the device and the heat rejecting junction is positioned near the perimeter of the device.

21. The device in claim 20 wherein the dissimilar conductor and semiconductor each comprise more than one layer.

22. The device in claim 20 wherein the semiconductor substrate is attached to the heat sink/spreader structure by wafer bonding.

23. The device in claim 20 wherein the heat rejecting junctions are located outside the bond line between the semiconductor substrate and heat sink/spreader structure.

24. The device in claim 20 wherein the heat sink/spreader structure is attached to more than one semiconductor substrate.

25. The device in claim 20 wherein the thermoelement couple is electrically in series with an electrical load other than itself.

26. The device in claim 20 wherein the semiconductor substrate attachment to the heat sink/spreader structure is electrically conductive.

27. A method of manufacturing a heat dissipating IC device including at least one IC die comprising a semiconductor substrate including at least one circuitry layer on at least one substrate face, more than one thermoelement couple, each with at least one heat absorbing and one heat rejecting junction and P-type and N-type conductive dopants comprising:

(a) Selectively depositing the P and N-type dopants into at least one face of the substrate to form a pattern of P and N-type conductive thermoelements within the semiconductor substrate;

(b) Electrically bonding the P and N-type conductivity thermoelements at heat absorbing and heat rejecting junctions to form thermoelement couples.

28. The method of claim 27 wherein the heat absorbing junctions are positioned near the center of the semiconductor substrate face and the heat rejecting junctions are positioned near the perimeter of the substrate face.

29. The method of claim 27 wherein a dielectric, such as oxide or nitride, is added to the physical regions between each P and N-type thermoelement in order to provide electrical insulation between each thermoelement.

30. The method of claim 27 wherein the physical regions between each P and N-type thermoelement are removed in order to provide electrical insulation between each thermoelement.

31. The method of claim 27 wherein a voltage is applied to at least one thermoelement couple.

32. The method of claim 27 wherein at least one thermoelement couple is electrically in series with an electrical load other than itself.

33. The method of claim 27 wherein at least thermoelement couple is utilized as a resistive load for an electronic component.

34. The method of claim 27 wherein a voltage and current is generated by at least one thermoelement couple and is consumed by an external electric load.

35. A heat dissipating IC device including at least one IC die comprising at least one semiconductor substrate including at least one circuitry layer on at least one substrate face, more than one thermoelement couple stage, each stage containing at least one thermoelement couple, each with at least one heat absorbing and heat rejecting junction, wherein each heat absorbing junction is positioned near the center of each thermoelement couple stage and heat rejecting junction is positioned near the perimeter of each stage and all thermoelement couple stages are fabricated within at least one semiconductor substrate.

36. The device in claim 35 wherein each successive thermoelement couple stage is laterally displaced from the previous stage and the heat source or object to be cooled.

37. The device in claim 35 wherein each stage is positioned outside the entire perimeter of the previous stage and each successive stage.

38. The device in claim 35 wherein a dielectric, such as oxide or nitride, is added to the physical regions between each thermoelement stage in order to maintain electrical insulation between each thermoelement.

39. The device in claim 35 wherein the thermoelement couple is electrically in series with an electrical load other than itself.

40. The device in claim 35 wherein each dissimilar thermoelement, comprising each thermoelement couple, is electrically bonded to each other at both the heat absorbing and heat rejecting junctions thereby creating closed electrical circuit thermoelement couples.

\* \* \* \* \*